(12) United States Patent
Dedic

(10) Patent No.: US 10,608,616 B2
(45) Date of Patent: Mar. 31, 2020

(54) CLOCK DISTRIBUTION

(71) Applicant: SOCIONEXT INC., Yokohama-shi, Kanagawa (JP)

(72) Inventor: Charles Joseph Dedic, London (GB)

(73) Assignee: SOCIONEXT INC., Yokohama (JP)

(*) Notice: Subject to any disclaimer, the term of this patent is extended or adjusted under 35 U.S.C. 154(b) by 0 days.

(21) Appl. No.: 16/244,002

(22) Filed: Jan. 9, 2019

(65) Prior Publication Data

US 2019/0229710 A1    Jul. 25, 2019

(30) Foreign Application Priority Data

Jan. 19, 2018  (EP) ..................................... 18152584

(51) Int. Cl.

| | |
|---|---|
| *H03K 3/017* | (2006.01) |
| *H03K 3/012* | (2006.01) |
| *H03K 5/05* | (2006.01) |
| *H03K 5/135* | (2006.01) |
| *G06F 1/06* | (2006.01) |
| *G06F 1/10* | (2006.01) |
| *H03K 5/01* | (2006.01) |
| *H03M 1/12* | (2006.01) |
| *H03K 5/00* | (2006.01) |
| *H03M 1/66* | (2006.01) |

(52) U.S. Cl.
CPC ............... *H03K 3/012* (2013.01); *G06F 1/06* (2013.01); *G06F 1/10* (2013.01); *H03K 3/017* (2013.01); *H03K 5/01* (2013.01); *H03K 5/05* (2013.01); *H03K 5/135* (2013.01); *H03K 2005/00032* (2013.01); *H03K 2005/00058* (2013.01); *H03K 2005/00215* (2013.01); *H03M 1/12* (2013.01); *H03M 1/66* (2013.01)

(58) Field of Classification Search
CPC ................. H01L 27/1104; H01L 27/11; H03K 19/00315; H03K 19/018521
See application file for complete search history.

(56) References Cited

U.S. PATENT DOCUMENTS

| | | | |
|---|---|---|---|
| 7,015,741 B2 | 3/2006 | Tschanz et al. | |
| 7,839,192 B1* | 11/2010 | Wang | ................... H03K 5/1565 327/175 |
| 8,198,930 B2 | 6/2012 | Zerbe et al. | |
| 2005/0134361 A1 | 6/2005 | Tschanz et al. | |
| 2005/0174156 A1 | 8/2005 | Wu et al. | |
| 2011/0102043 A1 | 5/2011 | Zerbe et al. | |

OTHER PUBLICATIONS

Pandit Nad et al: "Optimization of Delay and Leakage using Body Bias",, Jun. 1, 2013 (Jun. 1, 2013), pp. 3359-3363, XP55490592,New York, DOI: 10.1109/TVLSI.2003.817120 (Year: 2013).*

(Continued)

*Primary Examiner* — Sibin Chen
(74) *Attorney, Agent, or Firm* — Arent Fox LLP

(57) ABSTRACT

Clock distribution circuitry comprising: a plurality of first buffers and second buffers, the first and second buffers being inverting buffers; and control circuitry configured to generate first, second, third and fourth control signals for bulk-voltage control of transistors of the buffers, the control circuitry configured to control at least one of the first to fourth control signals as a variable signal.

16 Claims, 5 Drawing Sheets

(56) References Cited

OTHER PUBLICATIONS

Extended European Search Report of related European Patent Application No. 18152584.1, dated Jul. 19, 2018.
Nad, P, et al., "Optimization of Delay and Leakage using Body Bias", International Journal of Engineering Research & Technology (IJERT) ISSN: 2278-0181, vol. 2, Issue 6, Jun. 2013.
Liu, X, et al., "Performance of Submicron CMOS Devices and Gates with Substrate Biasing", ISCAS 2000, IEEE International Symposium on Circuits and Systems, Geneva, Switzerland, May 28-31, 2000.

* cited by examiner

Fig. 6

| Control signal | 1 | 3 | 4 | 2 |
|---|---|---|---|---|
| | AP | BP | AN | BN |
| 1 AP | Reduce A pulse-width (less) | Raise crossing point | Reduce A pulse-width | Increase slew (CLK2) |
| 3 BP | Raise crossing point | Increase A pulse-width (less) | Increase slew (CLK1) | Increase A pulse-width (more) |
| 4 AN | Reduce A pulse-width (more) | Increase slew (CLK1) | Reduce A pulse-width (less) | Lower crossing point |
| 2 BN | Increase slew (CLK2) | Increase A pulse-width (more) | Lower crossing point | Increase A pulse-width (less) |

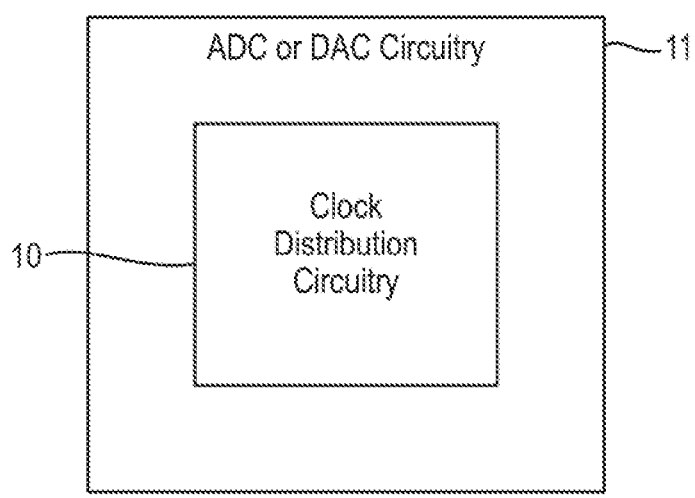

Fig. 7

CLOCK DISTRIBUTION

CROSS-REFERENCE TO RELATED APPLICATION

This application claims priority from European Patent Application N filed Jan. 19, 2018. The entire contents of the prior application are incorporated herein by reference.

The present invention relates to clock distribution circuitry and associated methods.

In particular, the present invention relates to clock distribution (or transmission) circuitry for example for use in circuitry requiring significant accuracy in the properties of a clock signal. Such circuitry may be implemented as integrated circuitry, for example on an IC chip.

In such circuitry, one or more clock signals may be distributed or transmitted from one circuit stage (e.g. a clock source) to another (e.g. clocked circuitry such as ADC or DAC circuitry). Such clocked circuitry may for example require one or more clock signals to be very accurate, so that its operation may also be very accurate.

With increasing speeds of such clocked circuitry, and thus of the clock signals that they employ, coupled with corresponding miniaturisation of semiconductor device sizes, and an increased focus on reducing energy consumption, there is ever-increasing pressure on operating such clocked circuitry accurately and at low power. This places a significant burden on clock distribution circuitry which provides the clocked circuitry with its clock signals.

It is desirable to provide improved clock distribution circuitry in the light of the above.

According to an embodiment of a first aspect of the present Invention, there is provided clock distribution circuitry comprising: a plurality of first buffers and second buffers, the first and second buffers being inverting buffers; and control circuitry configured to generate first, second, third and fourth control signals, wherein: the first buffers each comprise a pull-up circuit comprising one or more pull-up transistors connected for bulk-voltage control by the first control signal and a pull-down circuit comprising one or more pull-down transistors connected for bulk-voltage control by the second control, signal; the second buffers each comprise a pull-up circuit comprising one or more pull-up transistors connected for bulk-voltage control by the third control signal and a pull-down circuit comprising one or more pull-down transistors connected for bulk-voltage control by the fourth control signal; one of the first buffers and one of the second buffers are connected in series as a first buffer pair to form a first clock path for propagation of a clock signal therealong in a propagation direction; another one of the first buffers and another one of the second buffers are connected in series as a second buffer pair to form a second clock path for propagation of a clock signal therealong in the propagation direction; and the control circuitry is configured to control at least one of the first to fourth control signals as a variable signal.

Such circuitry enables the duty cycle of a said clock signal to be adjusted, e.g. dynamically. Such circuitry also enables the slew of a said clock signal to be adjusted. Such circuitry also enables the delay of a said clock signal to be adjusted. Such circuitry also enables the crossing point between two said clock signals to be adjusted. Such circuitry may enable all of the above adjustments to be carried out using only four independently controllable control signals. A small number of control signals is desirable since the processing burden on the circuitry may be reduced, and a size of the circuitry may also be reduced. Such adjustment may be carried out over time, e.g. for calibration of a system using the said clock signal, and also to compensate for e.g. voltage or temperature variations. Controlling a bulk voltage of a transistor of a buffer instead of controlling a DC-level of the input of the buffer has the advantage that any noise in the control signal is transmitted through Gmb rather than through Gm, (which, for example, leads to approximately ten times less input-referred noise), resulting in less jitter at the output of the buffer.

The control circuitry may be configured to control the first control signal independently of the third control signal, or the second control signal Independently of the fourth control signal, or both, in the sense that the two said control signals need not be the same. For example, one said control signal may be controlled to be variable and the other said control signal may be controlled to be have a non-variable voltage level, or both said control signals may be controlled to be variable, but they may be varied independently of one another.

The control circuitry may be configured to control at least two of the first to fourth control signals as variable signals, or at least three of the first to fourth control signals as variable signals, or each of the first to fourth control signals as variable signals, in the sense that the control circuit may be configured to change the values of the said control signals to carry out adjustment of the duty cycle, slew, delay and/or crossing point of the clock signals.

In the first buffer pair and the second buffer pair, the second buffer may be connected in series after the first buffer in the propagation direction, and the first buffer pair may be connected in series with the second buffer pair so that the first and second clock paths are part of the same combined clock path, in other words, the first and second buffer pairs may be connected in series to form a single buffer chain (which constitutes the combined clock path) that is four buffers long, comprising a first buffer as the first-stage buffer, a second buffer as the second-stage buffer, another first buffer as the third-stage buffer, and another second buffer as the fourth-stage buffer.

The control circuitry may be configured to control: any single one of the first to fourth control signals as a variable signal to control a duty cycle of the clock signal propagated along the combined clock path by a first amount; or either the first and fourth control signals together, or the second and third control signals together, to control the duty cycle of the clock signal propagated along the combined clock path by a second amount which is larger than the first amount; or either the first and second control signals together, or the third and fourth control signals together, to control a slew rate of the clock signal propagated along the combined clock path by a third amount.

Such circuitry enables all of the above adjustments to be carried out using only four independently controllable control signals.

In the first buffer pair, the second buffer may be connected in series after the first buffer in the propagation direction, in the second buffer pair, the first buffer may be connected in series after the second buffer in the propagation direction. The first and second clock paths may be arranged in parallel to one another, and connected to propagate complementary clock signals in parallel in the propagation direction. In other words, buffers of the first pair may be connected together in series, and buffers of the second pair may be connected together in series, to form two buffer chains (which constitute the first and second clock paths, respectively) each comprising two buffers, wherein one of the buffer chains comprises a first buffer as the first-stage buffer and a second buffer as the second-stage buffer, and the other buffer chain comprises a second buffer as the first-stage buffer and a first buffer as the second-stage buffer.

Another one of the first buffers and another one of the second buffers may be connected in series as a third buffer pair to form a third clock path for propagation of a clock signal therealong in the propagation direction, and another one of the first buffers and another one of the second buffers may be connected in series as a fourth buffer pair to form a fourth clock path for propagation of a clock signal therealong in the propagation direction.

In the third buffer pair, the second buffer may be connected in series after the first buffer in the propagation direction, in the fourth buffer pair, the first buffer may be connected in series after the second buffer in the propagation direction. The third buffer pair may be connected in series with the first buffer pair so that the first and third clock paths are part of a first combined clock path, and the fourth buffer pair may be connected in series with the second buffer pair so that the second and fourth clock paths are part of a second combined clock path parallel to the first combined clock path.

In other words, the clock distribution circuitry may comprise two buffer chains (constituting the first and second combined clock paths) that are each four buffers long, wherein one of the buffer chains comprises a first buffer as the first-stage buffer, a second buffer as the second-stage buffer, another first buffer as the third-stage buffer, and another second buffer as the fourth-stage buffer, and wherein the other buffer chain comprises a second buffer as the first-stage buffer, a first buffer as the second-stage buffer, another second buffer as the third-stage buffer, and another first buffer as the fourth-stage buffer.

The first and second combined clock paths may be arranged in parallel to one another and connected to propagate complementary clock signals in parallel in the propagation direction. In other words, the first combined clock path may be connected to propagate a first clock signal and the second combined clock path may be connected to propagate a second clock signal, and the first and second clock signals may be complementary to one another. The clock signals may be complementary to each other in the sense that they may have substantially the same frequency, and there may be a 180 degree phase difference between them. In other words, the first and second clock signals may be in antiphase with each other.

Cross-coupled inverters may be connected between like positions (corresponding positions) along the parallel clock paths. Such cross-coupled inverters at least partially act against any variance in duty cycle or slew between corresponding positions along the first combined clock path and the second combined clock path.

The buffers of cross-coupled inverters may be sufficiently small (in terms of transistor size) compared with buffers of buffer chains and so that they do not negate the effects of the buffers in buffer chains due to the control signals.

A cross-coupled inverter pair may comprise another one of the first buffers and another one of the second buffers; and the first buffer of the cross-coupled inverter pair may be connected to receive a clock signal output from a second buffer of one of the parallel clock paths (and to output a clock signal to a second buffer of the other of the parallel clock paths), and the second buffer of the cross-coupled inverter pair may be connected to receive a clock signal output from a first buffer of the said other parallel clock path (and to output a clock signal to a first buffer of the said one parallel clock path).

The control circuitry may be configured to control: any single one of the first to fourth control signals as a variable signal to control the duty cycle of the clock signal propagated along each clock path by a first amount; or either the first and fourth control signals together, or the second and third control signals together, to control the duty cycle of the clock signal propagated along each clock path by a second amount which is larger than the first amount; or either the first and third control signals together, or the second and fourth control signals together, to control the crossing point of the complementary clock signals; or either the first and second control signals together, or the third and fourth control signals together, or all of the first to fourth control signals as variable signals, to control the slew rate of the clock signal propagated along at least one of the clock paths.

Such circuitry enables all of the above adjustments to be carried out using only four independently controllable control signals.

The buffers may be larger in transistor size from buffer to buffer along each clock path in the propagation direction.

Such circuitry means that control of the first and third control signals together, or the second and fourth control signals together adjusts a crossing point of two said clock signals.

The control circuitry may be configured to obtain a measurement of the duty cycle of a clock signal output from a said clock path, and to control at least one said variable control signal to bring the duty cycle towards a target duty cycle. The target duty cycle may be variable, and/or it may be input by an operator of the clock distribution circuitry.

The control circuitry may be configured to obtain the measurement of the duty cycle by low-pass filtering the clock signal concerned. Such low-pass filtering generates a signal indicative of a DC level of the said clock signal, which is indicative of the duty of the said clock signal.

The control circuitry may be configured to obtain a measurement of a value of a property of a clock signal output from a said clock path, and to control at least one said variable control signal based on the measurement to bring the value of the property towards a target value. The property may be a duty cycle or a slew rate or a crossing point or a delay. The property may be a duty cycle and the control circuitry may be configured to obtain the measurement of the duty cycle by low-pass filtering the clock signal concerned.

The control circuitry may comprise an analogue-to-digital converter and a digital-to-analogue converter, and the control circuitry may be configured to employ the analogue-to-digital converter to convert the measurement (e.g. of the duty cycle) into an input digital signal, to generate an output digital signal from the input digital signal for controlling the at least one said variable control signal, and to employ the digital-to-analogue converter to generate the at least one said variable control signal from the output digital signal.

The control circuitry may be configured to control any said control signals not controlled as variable signals to have a respective non-variable voltage level.

The buffers may be connected between high-voltage and low-voltage sources, and the control circuitry may be configured to obtain each non-variable voltage level from (e.g. by—direct—connection to) the high-voltage or low-voltage source.

The clock distribution circuitry may be implemented as integrated circuitry optionally on an IC chip.

According to an embodiment of a second aspect of the present invention, there is provided integrated circuitry comprising the clock distribution circuitry of the aforementioned first aspect of the present invention.

According to an embodiment of a third aspect of the present invention, there is provided a method of controlling the clock distribution circuitry of the aforementioned first aspect of the present invention, the method comprising controlling: any single one of the first to fourth control signals as a variable signal to control a duty cycle of the clock signal propagated along the combined clock path by a first amount; or either the first and fourth control signals together, or the second and third control signals together, to control the duty cycle of the clock signal propagated along the combined clock path by a second amount which is larger than the first amount; or either the first and third control signals together, or the second and fourth control signals together, to control a slew rate of the clock signal propagated along the combined clock path by a third amount.

According to an embodiment of a fourth aspect of the present invention, there is provided a method of controlling the clock distribution circuitry of the aforementioned first aspect of the present invention, the method comprising controlling: any single one of the first to fourth control signals as a variable signal to control the duty cycle of the clock signal propagated along each clock path by a first amount; or either the first and fourth control signals together, or the second and third control signals together, to control the duty cycle of the clock signal propagated along each clock path by a second amount which is larger than the first amount; or either the first and third control signals together, or the second and fourth control signals together to control a crossing point of the complementary clock signals; or either the first and third control signals together, or the second and fourth control signals together, or all of the first to fourth control signals as variable signals, to control the slew rate of the clock signal propagated along at least one of the clock paths.

According to an embodiment of a fifth aspect of the present invention, there is provided a computer program configured to carry out the method of the aforementioned third aspect or fourth aspect of the present invention, when executed on a processor of the clock distribution circuitry of the aforementioned first aspect of the present invention.

According to an embodiment of a sixth aspect of the present invention, there is provided a computer-readable medium having the computer program of the aforementioned fifth aspect of the present invention stored thereon.

Reference will now be made, by way of example only, to the accompanying drawings, of which:

FIG. 8 is a table useful for understanding the circuitry of FIG. 1; and

FIG. 7 is a schematic diagram of digital-to-analogue converter (DAC) circuitry or analogue-to-digital converter (ADC) circuitry which may comprise the clock distribution circuitry of FIG. 1.

Before considering detailed circuitry arrangements, as an overview, clocked circuitry employing the clock signals output from clock distribution circuitry may for example require one or more very accurate clock signals, in the sense that the duty cycle must be within a given (small) range. Additionally, the slew of the clock signal and/or the crossing point between two complementary clock signals may need to be within a certain range. It may also be desirable to control the delay experienced by the clock signal. It is therefore desirable to be able to apply fine adjustments to the duty cycle, and also to those other properties of clock signals.

A main focus in the following disclosure is on adjusting the duty cycle of one or more clock signals. Other focuses include adjusting the slew of one or more clock signals, and adjusting a crossing point between two clock signals. A further focus is on adjusting a delay applied to one or more clock signals.

Figure 1:
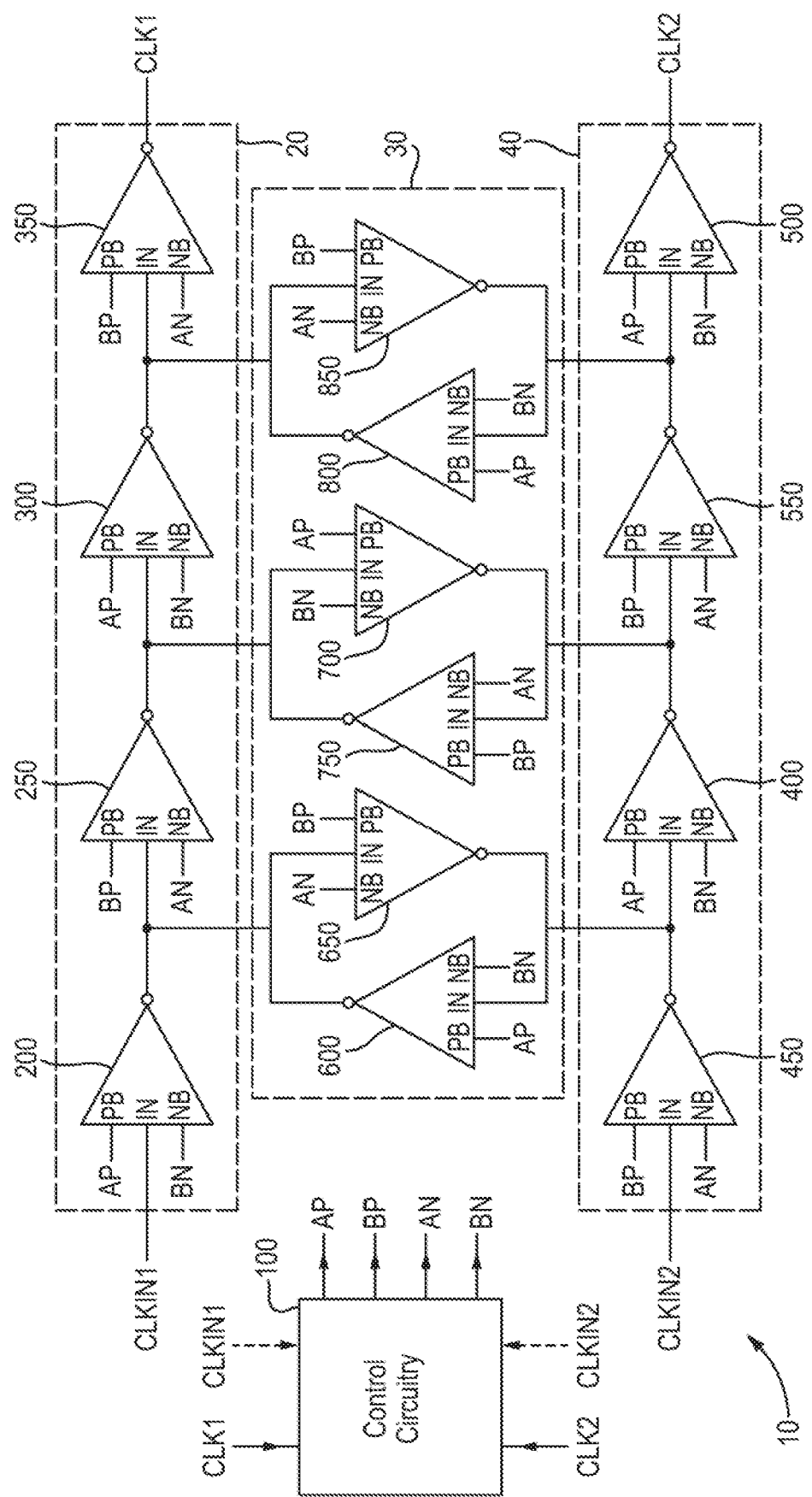
FIG. 1 is a schematic diagram of clock distribution circuitry.

FIG. 1 is a schematic diagram of clock distribution circuitry 10. Clock distribution circuitry 10 comprises a first group of buffers 200, 300, 400, 500, 600, 700 and 800, a second group of buffers 250, 350, 450, 550, 850, 750 and 850, and control circuitry 100.

The buffers are inverting buffers, and may be implemented as CMOS inverters as will be described later in connection with FIG. 3. The buffers are arranged into buffer chains 20 and 40 and a cross-linking unit 30, the cross-linking unit 30 comprising cross-coupled inverter pairs arranged between buffer chains 20 and 40. Buffer chain 20 comprises buffers 200, 250, 300 and 350 connected together in series (in that order). Buffer chain 40 comprises buffers 450, 400, 550 and 500 connected together in series (in that order). Buffer chain 20 is connected to receive a clock signal CLKIN1 and to output a clock signal CLK1. Buffer chain 40 is connected to receive a clock signal CLKIN2 and to output a clock signal CLK2.

The order in which the buffers are connected to form buffer chains 20 and 40 is such that in each chain, a buffer of the first group of buffers 200, 300, 400, 500, 600, 700 and 800 is connected in series with one or more buffers of the second group of buffers 250, 350, 450, 550, 650, 750 and 850, and so that a buffer of the second group of buffers 250, 350, 450, 550, 650, 750 and 850 is connected in series with one or more buffers of the first group of buffers 200, 300, 400, 500, 800, 700 and 800. In other words, from buffer to buffer in each buffer chain 20 and 40, buffers of the first group alternate with buffers of the second group. An example of this arrangement is presented in FIG. 1.

A first cross-coupled pair of buffers (a first cross-coupled inverter pair) comprises buffers 800 and 850, connected between buffers 200 and 250 of buffer chain 20 and buffers 450 and 400 of buffer chain 40. A second cross-coupled pair of buffers (a second cross-coupled inverter pair) comprises buffers 700 and 750, connected between buffers 250 and 300 of buffer chain 20 and buffers 400 and 550 of buffer chain 40. A third cross-coupled pair of buffers (a third cross-coupled inverter pair) comprises buffers 800 and 850, connected between buffers 300 and 350 of buffer chain 20 and buffers 550 and 500 of buffer chain 40.

Buffer 800 is connected to receive as its input a clock signal output from buffer 450 of buffer chain 40 and a clock signal output from buffer 650. Buffer 600 is connected to output a clock signal to buffer 250 of buffer chain 20 and to buffer 650. Buffer 650 is connected to receive as its input a clock signal output from buffer 200 of buffer chain and the clock signal output from buffer 800. Buffer 850 is connected to output a clock signal to buffer 400 of buffer chain 40 and to buffer 800. The second and third cross-coupled inverter pairs are connected in the same way with the corresponding buffers of buffer chains 20 and 40 between which they are connected, as indicated in FIG. 1.

Control circuitry 100 is connected to receive clock signals CLK1 and CLK2 output from buffer chains 20 and 40, respectively. Control circuitry 100 is connected to output control signals AP, BP, AN and BN. Control circuitry 100 is configured to output one or more of the control signals as variable signals (any others of them may be output as non-variable signals).

Buffer chain 20 and/or buffer chain 40 may comprise Just two buffers. For example, buffer chain 20 and/or buffer chain 40 may comprise only buffers 200 and 250, buffers 300 and 350, buffers 450 and 400, or buffers 550 and 500, or any other combination of a buffer from the first group of buffers and a buffer from the second group of buffers. Alternatively, buffer chain 20 and/or buffer chain 40 may comprise more than four buffers. Clock distribution circuitry 10 may comprise just a single buffer chain and therefore be configured to transmit a single (e.g. single-ended) clock signal. For example, clock distribution circuitry 10 may comprise Just buffer chain 20 or just buffer chain 40.

Clock distribution circuitry 10 may comprise just one cross-coupled inverter pair, or two, or none. Further, if the buffer chains 20 and 40 comprise more buffers, clock distribution circuitry 10 may comprise more cross-coupled inverter pairs, arranged so as to continue the pattern of cross-coupled inverter pairs as in FIG. 1.

Control circuitry 100 may receive just one of the clock signals CLK1 or CLK2. Control circuitry 100 outputs control signals AP, BP, AN and BN. It may be that just one, or just two, or just three, or all four of the control signals are used.

The clock signals CLKIN1 and CLKIN2 are complementary clock signals and, as such, have the same frequency and are 180 degrees out of phase with each other (within some defined tolerance), in other words, the phase difference between clock signals CLKIN1 and CLKIN2 is 180 degrees, in other words, clock signals CLKIN1 and CLKIN2 are in antiphase with each other. Similarly, clock signals CLK1 and CLK2 are complementary clock signals.

Buffers 200 to 850 each comprise a pull-up circuit and a pull-down circuit. The pull-up circuit comprises one or more pull-up transistors and the pull-down circuit comprises one or more pull-down transistors. Here the transistors are field-effect transistors (FETs), in particular MOSFETs. One or more of the one or more transistors of each path are connected for bulk-voltage control. In FIG. 1, the connection for bulk-voltage control of the pull-up circuit of each buffer is labelled PB and the connection for bulk-voltage control of the pull-down circuit of each buffer is labelled NB.

Although not shown in FIG. 1, the buffers increase in transistor size from buffer to buffer along each buffer chain, in detail, and in terms of the size of the transistors that each buffer comprises, buffer 350 is bigger than buffer 300, which in turn is bigger than buffer 250, which in turn is bigger than buffer 200. The same applies for the buffers of buffer chain 40. Further, for matching between the buffer chains 20 and 40, the buffers 200 and 450 have the same size as one another, the buffers 250 and 400 have the same size as one another, the buffers 300 and 550 have the same size as one another, and the buffers 350 and 500 have the same size as one another.

The buffers of the cross-coupled pairs are smaller than the buffers which make up the buffer chains 20 and 40, so that the buffers which make up the buffer chains 20 and 40 dominate. In this arrangement, the buffers of the cross-coupled pairs are the same size as one another. However in another arrangement they need not be the same size as one another. The buffers of the cross-coupled pairs may be smaller than the Initial buffers 200, 450.

Figure 2A:
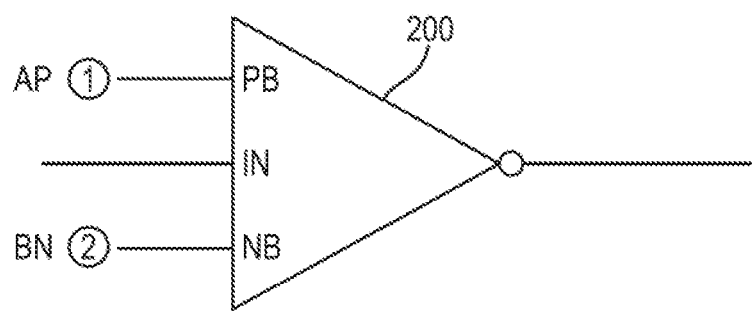
FIG. 2A is a schematic diagram of a first buffer.

FIG. 2A is a schematic diagram representative of a buffer 200 of the first group of buffers. It is, however, representative of any buffer of the first group of buffers, namely any of buffers 200, 300, 400, 500, 800, 700 and 800.

Buffer 200 comprises a pull-up circuit and a pull-down-circuit. As described above, the bulk voltages of the pull-up circuit and of the pull-down circuit can be controlled via the connections labelled PB and NB, respectively. Buffer 200 is connected to receive a first control signal to its PB connection and a second control signal to its NB connection. The first control signal is the control signal AP output from control circuitry 100 and the second control signal is control signal BN output from control circuitry 100. The other buffers 300, 400, 500, 800, 700 and 800 receive the same control signals to their PB and NB connections, respectively.

Figure 2B:
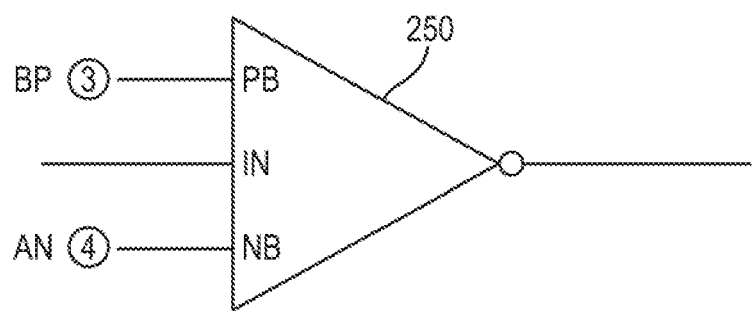
FIG. 2B is a schematic diagram of a second buffer.

FIG. 2B is a schematic diagram representative of a buffer 250 of the second group of buffers. It is, however, representative of any buffer of the second group of buffers, namely any of buffers 250, 350, 450, 550, 650, 750 and 850.

Buffer 250 comprises a pull-up circuit and a pull-down-circuit. As described above, the bulk voltages of the pull-up circuit and of the pull-down circuit can be controlled via the connections labelled PB and NB, respectively. Buffer 250 is connected to receive a third control signal to its PB connection and a fourth control signal to its NB connection. The third control signal is the control signal BP output from control circuitry 100 and the fourth control signal is control signal AN output from control circuitry 100. The other buffers 350, 450, 550, 850, 750 and 850 receive the same control signals to their PB and NB connections, respectively.

In summary, each buffer of the first group of buffers 200, 300, 400, 500, 800, 700 and 800 receives the first control signal AP to its PB connection and the second control signal BN to its NB connection, and each buffer of the second group of buffers 250, 350, 450, 550, 650, 750 and 850 receives the third control signal BP to its PB connection and the fourth control signal AN to its NB connection.

The significance of PB, NB, and AP, BN, BP and AN will become more apparent on consideration of FIG. 3 later herein. For now, by controlling the pull-up and pull-down circuits of the buffers in this way, the duty cycle of a said clock signal may be controlled, as is described below. Further, the slew rate of a said clock signal, and/or the crossing point between the two complementary clock signals CLK1 and CLK2 may be controlled, as is described below. Further, the delay of a said clock signal may be controlled, as is described below.

Figure 3:
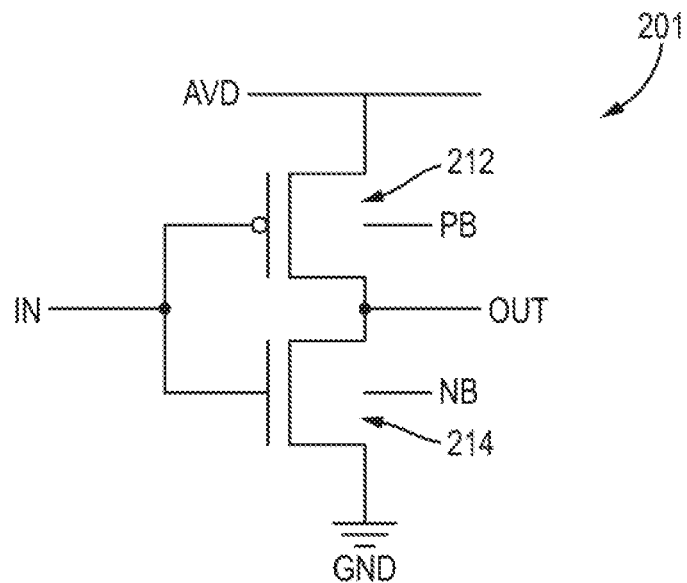
FIG. 3 is a schematic diagram of buffer circuitry.

FIG. 3 is a schematic diagram representative of buffer circuitry 201 of any of buffers 200 to 800.

Buffer circuitry 201 may be readily described as a CMOS inverter. It will appreciated that a CMOS inverter is an example of a simple CMOS circuit with only one pull-up PMOS transistor and only one pull-down NMOS transistor. However, it will also be appreciated that more complicated CMOS circuitry having an inverting function is possible, for example having two or more pull-up and/or pull-down transistors.

Buffer circuitry 201 comprises a PMOS transistor 212 and an NMOS transistor 214. PMOS transistor 212 is an example of a pull-up transistor and NMOS transistor 214 is an example of a pull-down transistor. Transistors 212 and 214 are connected together between a first reference voltage source, in this case AVD, and a second reference voltage source, in this case GND (ground). PMOS transistor 212 is connected to receive a control signal (the first or the third control signal, which is the control signal AP or BP) to its bulk connection labelled PB (i.e. PMOS Bulk). The bulk voltage of PMOS transistor 212 may therefore be controlled by that control signal, for example influencing the threshold voltage and causing the buffer 200 to switch high earlier. NMOS transistor 214 is connected to receive a control signal (the second or the fourth control signal, which is BN or AN) to its bulk connection labelled NB (i.e. NMOS Bulk). The bulk voltage of the NMOS transistor may therefore be controlled by that control signal, for example influencing the threshold voltage and causing the buffer 200 to switch low earlier.

As described above, control circuitry 100 is configured to output one or more of the control signals as variable signals, i.e. to actively or dynamically control a value of those control signals to control the property (e.g. duty cycle) of the clock signal concerned.

Any control signals not controlled by control circuitry 100 as variable signals may thus be controlled to have a non-variable voltage level, i.e. a fixed voltage level which Is not actively or dynamically controlled to control the property (e.g. duty cycle) of the clock signal concerned. Looking at FIGS. 2 and 3, this fixed voltage level could be the high-voltage level (AVD, considered to be the PMOS "standard" level for the sake of example)—or some other voltage level—for the first or the third control signal AP or BP if either of those is a non-variable signal. Similarly, this fixed voltage level could be the low-voltage level (GND, considered to be the NMOS "standard" level for the sake of example)—or some other voltage level—for the second or the fourth control signal BN or AN if either of those is a non-variable signal. For example, for such a non-variable signal the control circuitry could simply "hardwire" the signal to the relevant voltage level (e.g. by connection to the relevant reference voltage source), or could control the signal (e.g. with the output of a DAC) to have a fixed voltage level (e.g. by not varying the input to that DAC dynamically or actively to control the property of the clock signal concerned).

Figure 4:
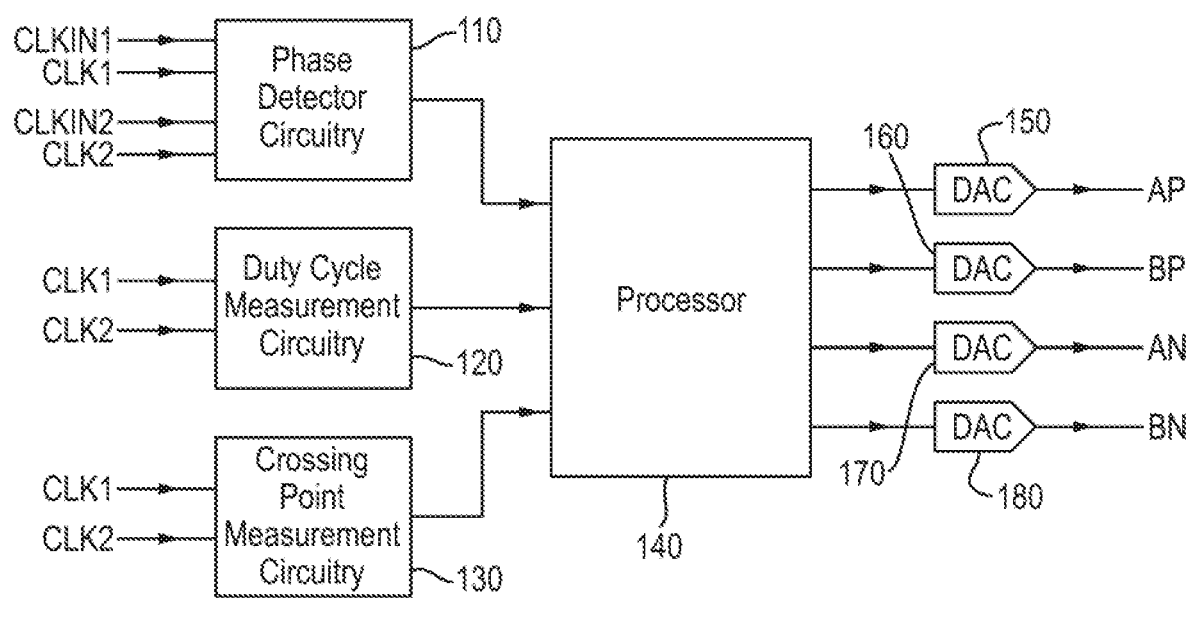
FIG. 4 is a schematic diagram of control circuitry.

FIG. 4 is a schematic diagram representative of control circuitry 100. Control circuitry 100 comprises phase detector circuitry 110, duty cycle measurement circuitry 120, crossing point measurement circuitry 130, a processor 140, and digital-to-analogue converters (DACs) 150, 160, 170 and 180, The four digital-to-analogue converters (DACs) 150, 180, 170 and 180 have been provided to allow for the possibility for each of the control signals AP, BP, AN and BN to be a variable control signal, however as mentioned above it is not necessary for ail of them to be a variable control signal. Phase detector circuitry 110 may be used to measure the delay of one or both of the clock signals CLK1 and CLK2.

Depending on the application for which clock distribution circuitry 10 is being used, control circuitry 100 may comprise Just one or two of phase defector circuitry 110, duty cycle measurement circuitry 120 and crossing point measurement circuitry 130, or it may comprise all three as shown in FIG. 4.

Phase detector circuitry 110, duty cycle measurement circuitry 120 and/or crossing point measurement circuitry 130 may receive Just one of the clock signals CLK1 and CLK2 instead of both clock signals CLK1 and CLK2. Phase detector circuitry 110 may receive just one of the clock signals CLKIN1 and CLKIN2 instead of both clock signals CLKIN1 and CLKIN2. Further, phase detector circuitry 110, duty cycle measurement circuitry 120 and/or crossing point measurement circuitry 130 may receive a clock signal output from a buffer of buffer chain 20 or buffer chain 40 other than the buffer arranged at the output stage of the said buffer chain.

Duty cycle measurement circuitry 120 may comprise low-pass filter circuitry configured to output a signal indicative of a DC-level of one or both of clock signals CLK1 and CLK2. Crossing point measurement circuitry 130 may be similarly comprised.

Processor 140 is connected to receive one or more signals indicative of one or more properties (i.e. phase, duty cycle, crossing point) of one or both of clock signals CLK1 and CLK2 and outputs, via DACs 150, 180, 170 and 180, control signals AP, BP, AN and BN, respectively. Processor 140 outputs the control signals to control the duty cycle, the delay and/or the phase of one or both of clock signals CLK1 and CLK2. It will be appreciated that the processor may carry out its control by executing a computer program, which program may be stored on a computer-readable medium (not shown).

It will be appreciated that control circuitry 100 may have other configurations. Control circuit 100 may be configured to measure the slew of one or more clock signals, and to output control signals to adjust the slew, Such measurement may be carried out by analysing the output clock signal, e.g. by analysing jitter in the output clock signal.

Control circuitry 100 may comprise Just a processor configured to be controlled in order to output the control signals.

Figure 5:
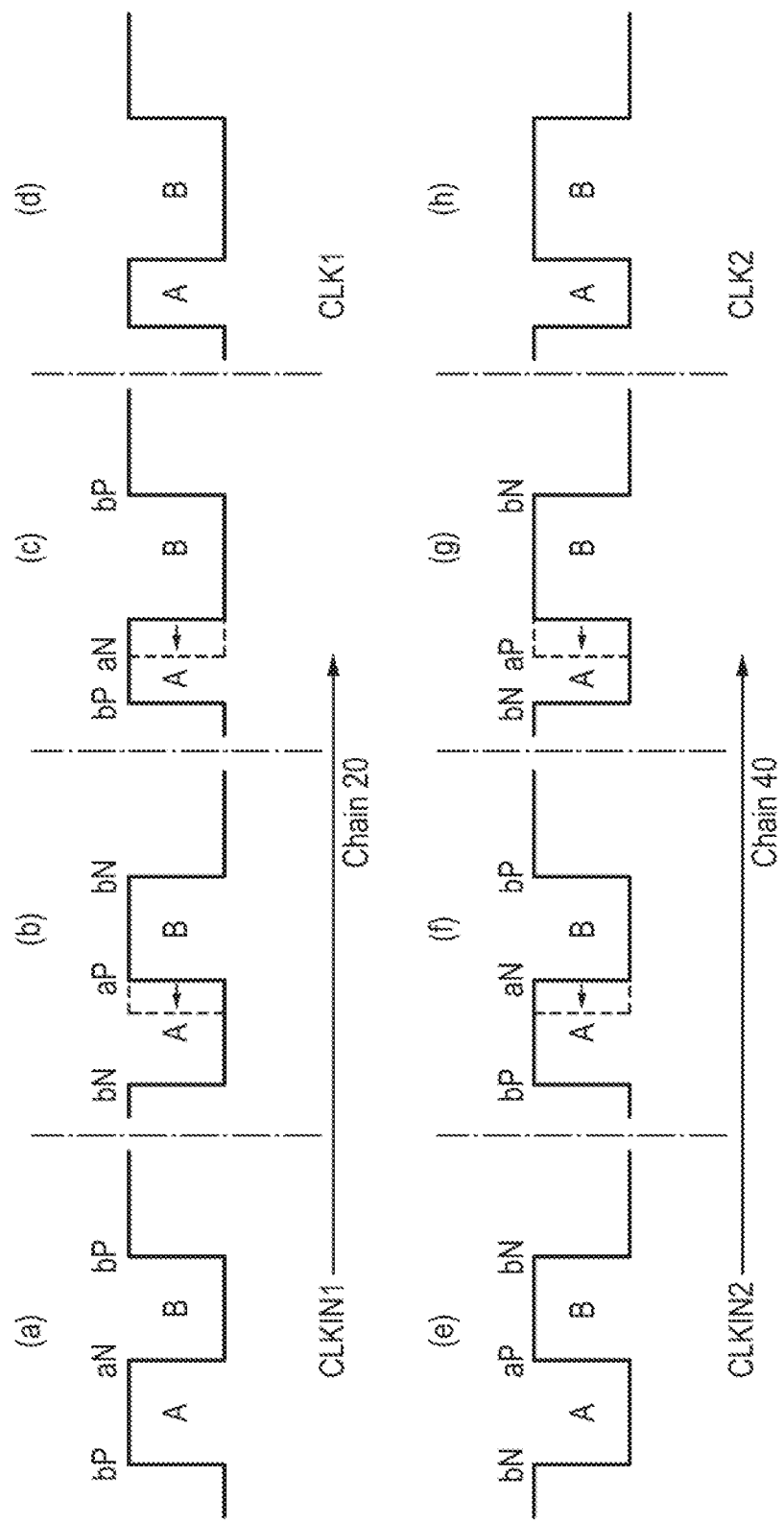
FIG. 5 is a signal timing diagram useful for understanding the circuitry of FIG. 1.

FIG. 5 is a signal timing diagram useful for understanding the operation of clock distribution circuitry 10.

FIG. 5 shows the evolution of two clock signals as they are transmitted along first and second buffer chains, respectively. In the example illustrated in FIG. 5, buffer chain 20 comprises a buffer of the first group of buffers (a first buffer) followed by a buffer of the second group of buffers (a second buffer), connected in series, and buffer chain 40 comprises a buffer of the second group (a second buffer) followed by a buffer of the first group (a first buffer), connected in series. In other words, for simplicity, in the case of FIG. 5 buffer chains 20 and 40 may be taken to be half of each of buffer chains 20 and 40 illustrated in FIG. 1 (i.e. buffers 200 and 250 and buffers 450 and 400).

In this example, control circuit 100 modifies a bulk voltage of the pull-up circuit of the first buffers 200 and 400 (from a "standard" value such as AVD) via the first control signal AP, and modifies a bulk voltage of the pull-down circuit of the second buffers 250 and 450 (from a "standard" value such as GND) via the fourth control signal AN. The second and third control signals BN and BP are controlled to have non-variable voltage levels (in this case, "standard" values GND and AVD, respectively).

Hereinafter, modifying a bulk voltage will be understood as dynamically or actively controlling it, for example changing it from its standard value (GND for NMOS or pull down, and AVD for PMOS or pull up). Similarly, controlling one of the control signals to be variable, or modifying it, will be assumed to correspond to dynamically or actively controlling it to control the corresponding bulk voltage, for example changing it from its standard value (GND for NMOS or pull down, and AVD for PMOS or pull up).

Clock signals CLKIN1 and CLKIN2 are illustrated in (a) and (e), respectively. For simplicity, clock signals CLKIN1 and CLKIN2 are shown as ideal square waves. In practice, however, the edges will be slewed, and this slew will change as the control signals are varied. For the purpose of this example, however, any change in stew will be disregarded for simplicity. Also, duty cycle changes will be exaggerated.

The clock signal output from the first buffer 200 is illustrated in (b) and the clock signal output from the second buffer 250 is illustrated in (c)

The pulses of the clock signals illustrated in FIG. 5 are labelled A and B. Positive pulses of clock signal CLKIN1 are labelled A, and negative pulses of clock signal CLKIN1 are labelled B. Negative pulses of clock signal CLKIN2, which occur together with the positive pulses of clock signal CLKIN1, are labelled A, and positive pulses of clock signal CLKIN2, which occur together with the negative pulses of clock signal CLKIN1, are labelled B. Thus, A pulses occur together between the two buffer chains, and B pulses occur together between the two buffer chains, and overall the pulses alternate between A and B.

The pulses of the clock signals as they pass through buffers are similarly labelled. For example in (b), in which a clock signal output from the first buffer 200 is illustrated, negative pulses are labelled A and positive pulses are labelled B, so that a pulse (e.g. A) can be followed through the buffer chain.

The edges of each clock signal are also labelled. The rising edges of clock signal CLKIN1 are labelled bP (P for rising due to PMOS and b for the label of the pulse that precedes the edge). The falling edges of clock signal CLKIN1 are labelled aN (N for falling due to NMOS and a for the label of the pulse that precedes the edge). Similarly, the rising edges of clock signal CLKIN2 are labelled aP (P for rising and a for the label of the pulse that precedes the edge) and the falling edges of clock signal CLKIN2 are labelled bN (N for falling and b for the label of the pulse that precedes the edge).

Clock signal CLKIN1 is received by first buffer 200. The clock signal output from first buffer 200 is illustrated in (b). The modification of the bulk voltage by the first control signal AP has the effect of bringing the edge labeled aP forwards. This is shown by the dotted line in (b). The modification of the bulk voltage also has the effect of increasing the slew of the edge labelled aP, but such effects are disregarded in this example and are not illustrated in FIG. 5. The clock signal output from first buffer 200 is received by second buffer 250. The clock signal output from second buffer 250 is shown in (c) and in (d). The modification of the bulk voltage by the fourth control signal AN has the effect of bringing the edge labelled aN forwards. This is illustrated in (c) by the dotted line. Clock signal CLK1 output from buffer chain 20 is shown in (d). The edge labelled aN in (c) corresponds with the edge labelled aP in (b), i.e. the first and fourth control signals AP and AN control the same edge of the clock signal CLK1.

Clock signal CLKIN2 is received by second buffer 450 (i.e. a buffer of the second group of buffers). The clock signal output from second buffer 450 is illustrated in (f). The modification of the bulk voltage by the fourth control signal AN has the effect of bringing the edge labelled aN forwards. This is shown by the dotted line in (f). The clock signal output from second buffer 450 is received by first buffer 400. The clock signal output from first buffer 400 is shown in (g) and in (h). The modification of the bulk voltage by the first control signal AP has the effect of bringing the edge labelled aP forwards. This is illustrated in (g) by the dotted line. Clock signal CLK2 output from buffer chain 40 is shown in (h). The edge labelled aP in (g) corresponds with the edge labelled aN in (f), i.e. the first and fourth control signals AP and AN control the same edge of the clock signal CLK2.

It can be seen from (d) and (h) that the duty cycle of each of clock signals CLK1 and CLK2 has been changed. The duty cycle has been altered so that the pulse-width of the A pulse has been reduced (and so the pulse-width of the B pulse has been increased), in both CLK1 and in CLK2.

It can be seen from clock signals CLK1 and CLK2 illustrated in (d) and (h), respectively, that the two clock signals have been controlled so that, although the duty cycle of each has been changed, they are still complementary to one another.

It is readily apparent that were each buffer chain to be extended to the buffer chains 20 and 40 depicted in FIG. 1, the same effect would be obtained (though the effect would be larger).

It will be appreciated that first and fourth control signals AP and AN need not be of the same magnitude (i.e. they may cause the said edge to be brought forwards by different amounts) for the above effects to be obtained.

FIG. 6 is a table showing the effect on the clock signals) of controlling different control signals to be variable.

For example, the first entry, "Reduce A pulse-width (less)", describes the effect of control circuit 100 controlling the first control signal, AP, to be variable. In this case, a bulk voltage of the pull-up path in buffers of the first group of buffers is modified, and so the "aP" edge of clock signals transmitted by such buffers will be brought forward, thereby altering the duty cycle so that the pulse-width of the A pulse is reduced. This effect is the same as the effect when control circuit controls the first and fourth control signals AP and AN to be variable. In this case, however, the effect is smaller since the relevant edge is only altered when the clock signal is transmitted by buffers of the first group of buffers, whereas when control circuit 100 controls both the first and the fourth control signals AP and AN to be variable, the relevant edge is brought forward when the clock signal is transmitted by buffers of the first group and buffers of the second group.

Similarly, the effect of control circuit 100 controlling the third control signal BP to be variable is to change the duty cycle so that the pulse-width of the A pulse is increased. It can be readily seen, following the logic in FIG. 6, that the effect of control circuit 100 controlling both the third and second control signals BP and BN to be variable is to change the duty cycle so that the pulse-width of the A pulse is increased, and also that the effect in this case is greater than when just the third control signal BP is controlled to be variable.

The effect of control circuit 100 controlling just the fourth control signal AN or just the second control signal BN is also readily apparent, following the logic in FIG. 5.

As described above, when an edge of a clock signal is brought forward by modifying a bulk voltage, the slew of that edge (of the clock signal that is output from the buffer whose bulk voltage has been modified) is increased, i.e. to change the slew of the clock signal CLK1 or CLK2, a bulk voltage of the last-stage buffer in the said buffer chain 20 or 40 should be modified. In other words, modifying a bulk voltage of a buffer other than the last buffer in the said buffer chain 20 or 40 does not generally affect the slew of the said clock signal CLK1 or CLK2. In an example, control circuit 100 controls the first and second control signals AP and BN to be variable, thus modifying the bulk voltage of a pull-up circuit of buffers of the first group of buffers and a pull-down circuit of buffers of the first group of buffers, thereby bringing both edges of a said clock signal forward. In this case, and provided the edges are brought forward by the same amount the duty cycle of the said clock signal is unchanged. However, the slew of clock signal CLK2 is increased. This increased slew comes with the cost of increased power consumption. Therefore, clock distribution circuitry 10 enables the balance between slew (and delay)

versus power consumption to be controlled. Additionally in this example, the delay of the said clock signal is reduced (i.e. the delay of clock signal CLK1 compared with CLKIN1 is reduced, and the delay of clock signal CLK2 compared with CLK2IN is reduced).

When control circuit 100 controls the third and fourth control signals BP and AN to be variable, the slew of clock signal CLK1 is increased as shown in FIG. 8. Additionally, the delay of both clock signals CLK1 and CLK2 compared with CLKIN1 and CLKIN2, respectively, is reduced.

As described above, the buffers increase in transistor size from buffer to buffer along each buffer chain. Therefore, the effect of a change in bulk voltage on the amount a particular edge is brought forward in time, is bigger at earlier stages in the buffer chain than at later stages (although the same applies to the change in slew of an edge due to bulk voltage control, only the effect on the slew of the last buffer in the buffer chain 20 or 40 is essentially what is seen in the clock signal CLK1 or CLK2). This is because, due to their reduced transistor size, buffers at earlier stages switch more slowly than buffers at later stages (i.e. clock signals output from earlier stage buffers have lower slew than clock signals output from buffers at later stages). Since the earlier-stage buffers are slower than later-stage buffers, a bulk voltage range corresponds with a bigger range of time in a clock signal output from an earlier-stage buffer than in a clock signal output from a later-stage buffer, and thus the same change in bulk voltage has a bigger effect at earlier-stage buffers than at later-stage buffers, in detail, an edge is brought forward by a larger amount at earlier-stage buffers compared with later-stage buffers.

Therefore, in the example described above in which control circuit 100 controls first control signal AP to be variable, modifying a bulk voltage of a pull-up path in buffers of the first group of buffers, the duty cycle of clock signal CLK1 will be changed more than the duty cycle of clock signal CLK2 (there is approximately a 26% difference in effect between the two clock paths in this case). This is because the buffers whose bulk voltages are modified are at a first stage and a third stage in buffer chain 20 and at a second stage and a fourth stage in buffer chain 40. It is therefore advantageous in this case to control both first and fourth control signals AP and AN to be variable, so that each buffer in both buffer chains 20 and 40 contribute to the change in duty cycle of both clock signals CLK1 and CLK2, and thus the duty cycle is changed by the same amount in both clock signals.

In the example described above in which control circuit 100 controls the first and second control signals AP and BN to be variable, modifying the bulk voltage of a pull-up circuit of buffers of the first group of buffers and a pull-down circuit of buffers of the first group of buffers, the effect is smaller for the clock signal CLK2 compared with clock signal CLK1, if the configuration of clock distribution circuitry 10 of FIG. 1 is used. Due to this, and due to the change in slew of clock signal CLK2, the delay of each clock signal CLK1 and CLK2 compared with clock signals CLKIN1 and CLKIN2, respectively, may be different.

It is readily apparent from the above description and from FIG. 1 that the effect of control circuit 100 controlling third and fourth signals BP and AN is to increase the slew of clock signal CLK1, and to reduce the delay of both clock signals CLK1 and CLK2 potentially by different amounts.

In another example, control circuit 100 controls first and third control signals AP and BP to be variable. In the single-ended case (i.e. when clock distribution circuitry 100 composes a single buffer chain), the effect of such control by control circuitry 100 is an Increase in positive slew rate (i.e. the slew rate of the rising edges) and a reduction in the delay of the outputted clock signal compared with the said input clock signal (i.e. CLK1 compared with CLKIN1 or CLK2 compared with CLKIN2). This can be readily understood in light of the description above.

In the example in which control circuit 100 controls first and third control signals AP and BP to be variable in the double-ended case (i.e. when clock distribution circuitry 100 comprises two buffer chains), the effect is that both clock signals CLK1 and CLK2 have increased positive slew (and reduced delay). Further, the crossing point between clock signals CLK1 and CLK2 is raised. This is because, as described above, modifying bulk voltages of earlier-stage buffers has a greater effect than modifying bulk voltages in later-stage buffers. In the case of this example, a rising edge of a clock signal output from buffer 200, which would be labelled aP, is brought forward, and a rising edge of a clock signal output from buffer 250, which would be labelled bP, is also brought forward. Further, a rising edge of a clock single output from buffer 460, which would be labelled bP, is brought forward, and a rising edge of a clock signal output from buffer 400, which would be labelled aP, is brought forward. The rising edge aP of the clock signal output from buffer 200 corresponds in the final output signal with the rising edge aP of the clock signal output from buffer 400. Similarly, the rising edge bP of the clock signal output from buffer 250 corresponds with the rising edge bP of the clock signal output from buffer 450. Assuming for the purposes of this example that the first and third control signals AP and BP are substantially equal, the rising edge aP of the clock signal output from buffer 200 is brought forward by a greater amount (and its slew increased by a greater amount) than rising edge aP of the clock signal output from buffer 400, since buffer 200 is a first-stage buffer and buffer 400 is a second-stage buffer, and so buffer 200 is smaller (In terms of transistor size) than buffer 400. Similarly, the rising edge bP of the clock signal output from buffer 450 is brought forward by a greater amount (and its slew increased by a greater amount) than the rising edge bP of the clock signal output from buffer 250, since buffer 450 is a first-stage buffer and buffer 250 is a second-stage buffer, and so buffer 450 is smaller (in terms of transistor size) than buffer 250. This difference has the effect of raising the crossing point between clock signals CLK1 and CLK2 (if is readily apparent how this effect is repeated in buffers 300, 350, 550 and 500, in the case that each buffer chain comprises four buffers).

Similarly, in an example in which control circuit 100 controls second and fourth control signals BN and AN to be variable, the crossing point between clock signals CLK1 and CLK2 is lowered. Also in this example, the clock signals CLK1 and CLK2 will have an increased negative slew rate (i.e. the slew rate of falling edges) due to this bulk voltage control.

Although not illustrated in FIG. 8, it will be readily understood that in an example in which control circuit 100 controls first, second, third and fourth control signals AP, BN, BP and AN to be variable, the slew of both of the clock signals CLK1 and CLK2 will be increased. Additionally, the delay of both clock signals CLK1 and CLK2 will be reduced. In the case of single-ended clock distribution circuitry 10, controlling first, second, third and fourth control signals AP, BN, BP and AN to be variable will cause the slew of the clock signal output from the buffer chain to be increased, and its delay reduced. This increased slew (and reduced delay) comes with the cost of increased power consumption. Therefore, as mentioned above, clock distribution circuitry 10 enables the balance between slew (and delay) versus power consumption to be controlled.

In the examples described above, it is assumed that when a plurality of control signals AP, BN, BP or AN are controlled by control circuitry 100 to be variable, they are controlled (i.e. actively controlled) such that they have the same magnitude as one another or, in other words, so that they affect an edge with the same magnitude as one another (ignoring for the moment the differences in transistor size between certain buffers). However, the control signals need not have the same magnitude.

Clock distribution circuitry need not comprise cross-linking unit 30. In examples in which clock distribution circuitry does comprise cross-linking unit 30, the buffers of cross-linking unit 30 may be sufficiently small (in terms of transistor size) compared with buffers of buffer chains 20 and 40 so that cross-linking unit 30 does not negate or overpower to too much of an extent the effects of the buffers in buffer chains 20 and 40 described above.

By the above configuration of clock distribution circuitry 10, the duty cycle of one or more clock signals may be measured and adjusted. The duty cycle may be adjusted in order to bring it towards a target value. Further, the slew of one or more clock signals, and/or the crossing point between two clock signals may be adjusted. Further, the delay of one or more clock signals may be adjusted. In clock distribution circuitry 10, such functionality requires only four independently controllable control signals, even in examples where clock distribution circuitry 10 comprises too buffer chains.

Such circuitry may enable all of the above adjustments to be carried out using only four independently controllable control signals, no matter how Song the buffer chains are (in terms of numbers of buffers). A small number of control signals is desirable since the processing burden on the circuitry may be reduced, and a size of the circuitry may also be reduced. Such adjustment may be carried out over time (such as in use), e.g. for calibration and control of a system using the said clock signal, and also to compensate for e.g. voltage or temperature variations. Controlling a bulk voltage of a transistor of a buffer instead of controlling a DC-level of the Input of the buffer has the advantage that any noise in the control signal is transmitted through Gmb rather than through Gm, (which, for example, leads to approximately ten times less input-referred noise), resulting in less jitter at the output of the buffer.

It will be appreciated that clock distribution circuitry 10 embodying the present invention could be provided along with mixed-signal circuitry such as DAC or ADC circuitry. For example, clock distribution circuitry 10 disclosed herein—provided along with DAC or ADC circuitry—could be described as a DAC or an ADC 11, as illustrated in FIG. 7. Clock distribution circuitry 10 could also be provided as part of or coupled to other circuitry employing clock signals, such as Time-to-Digital converters (TDC), Phase Locked Loops (PLL) or Voltage Controlled Oscillators (VCO).

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

In any of the above aspects, the various features may be implemented in hardware, or as software modules running on one or more processors. Features of one aspect may be applied to any of the other aspects.

The invention also provides a computer program or a computer program product for carrying out any of the methods described herein, and a computer readable medium having stored thereon a program for carrying out any of the methods described herein. A computer program embodying the Invention may be stored on a computer-readable medium, or it could, for example, be in the form of a signal such as a downloadable data signal provided from an internet website, or if could be in any other form.

Further embodiments may be provided within the spirit and scope of the present invention as disclosed herein.

The invention claimed is:

1. Clock distribution circuitry comprising:
   a plurality of first buffers and second buffers, the first and second buffers being inverting buffers; and
   control circuitry configured to generate first, second, third and fourth control signals,
   wherein:
   the first buffers each comprise a pull-up circuit comprising one or more pull-up transistors connected for bulk-voltage control by the first control signal and a pull-down circuit comprising one or more pull-down transistors connected for bulk-voltage control by the second control signal;
   the second buffers each comprise a pull-up circuit comprising one or more pull-up transistors connected for bulk-voltage control by the third control signal and a pull-down circuit comprising one or more pull-down transistors connected for bulk-voltage control by the fourth control signal;
   one of the first buffers and one of the second buffers are connected in series as a first buffer pair to form a first clock path for propagation of a clock signal therealong in a propagation direction;
   another one of the first buffers and another one of the second buffers are connected in series as a second buffer pair to form a second clock path for propagation of a clock signal therealong in the propagation direction; and
   the control circuitry is configured to control at least one of the first to fourth control signals as a variable signal,
   wherein the control circuitry is configured to obtain a measurement of a value of a property of a clock signal output from a said clock path, and to control at least one said variable control signal based on the measurement to bring the value of the property towards a target value.

2. The clock distribution circuitry as claimed in claim 1, wherein the control circuitry is configured to control the first control signal independently of the third control signal, or the second control signal independently of the fourth control signal, or both.

3. The clock distribution circuitry as claimed in claim 1, wherein the control circuitry is configured to control at least two of the first to fourth control signals as variable signals, or at least three of the first to fourth control signals as variable signals, or each of the first to fourth control signals as variable signals.

4. The clock distribution circuitry as claimed in claim 1, wherein:
   in the first buffer pair and the second buffer pair, the second buffer is connected in series after the first buffer in the propagation direction; and
   the first buffer pair is connected in series with the second buffer pair so that the first and second clock paths are part of the same combined clock path.

5. The clock distribution circuitry as claimed in claim 4, wherein the control circuitry is configured to control:
  any single one of the first to fourth control signals as a variable signal to control a duty cycle of the clock signal propagated along the combined clock path by a first amount; or
  either the first and fourth control signals together, or the second and third control signals together, to control the duty cycle of the clock signal propagated along the combined clock path by a second amount which is larger than the first amount; or
  either the first and second control signals together, or the third and fourth control signals together, to control a slew rate of the clock signal propagated along the combined clock path by a third amount.

6. The clock distribution circuitry as claimed in claim 1, wherein:
  in the first buffer pair, the second buffer is connected in series after the first buffer in the propagation direction;
  in the second buffer pair, the first buffer is connected in series after the second buffer in the propagation direction; and
  the first and second clock paths are arranged in parallel to one another, and connected to propagate complementary clock signals in parallel in the propagation direction.

7. The clock distribution circuitry as claimed in claim 6, wherein:
  another one of the first buffers and another one of the second buffers are connected in series as a third buffer pair to form a third clock path for propagation of a clock signal therealong in the propagation direction;
  another one of the first buffers and another one of the second buffers are connected in series as a fourth buffer pair to form a fourth clock path for propagation of a clock signal therealong in the propagation direction;
  in the third buffer pair, the second buffer is connected in series after the first buffer in the propagation direction;
  in the fourth buffer pair, the first buffer is connected in series after the second buffer in the propagation direction; and
  the third buffer pair is connected in series with the first buffer pair so that the first and third clock paths are part of a first combined clock path; and
  the fourth buffer pair is connected in series with the second buffer pair so that the second and fourth clock paths are part of a second combined clock path parallel to the first combined clock path.

8. The clock distribution circuitry as claimed in claim 6, wherein cross-coupled inverters are connected between corresponding or like positions along the parallel clock paths.

9. The clock distribution circuitry as claimed in claim 8, wherein:
  each cross-coupled inverter pair comprises another one of the first buffers and another one of the second buffers; and
  for each cross-coupled inverter pair, the first buffer of the cross-coupled inverter pair is connected to receive a clock signal output from a second buffer of one of the parallel clock paths, and the second buffer of the cross-coupled inverter pair is connected to receive a clock signal output from a first buffer of the other of the parallel clock paths.

10. The clock distribution circuitry as claimed in claim 6, wherein the control circuitry is configured to control:
  any single one of the first to fourth control signals as a variable signal to control the duty cycle of the clock signal propagated along each clock path by a first amount; or
  either the first and fourth control signals together, or the second and third control signals together, to control the duty cycle of the clock signal propagated along each clock path by a second amount which is larger than the first amount; or
  either the first and third control signals together, or the second and fourth control signals together, to control the crossing point of the complementary clock signals; or
  either the first and second control signals together, or the third and fourth control signals together, or all of the first to fourth control signals as variable signals, to control the slew rate of the clock signal propagated along at least one of the clock paths.

11. The clock distribution circuitry as claimed in claim 1, wherein the buffers are larger in transistor size from buffer to buffer along each clock path in the propagation direction.

12. The clock distribution circuitry as claimed in claim 1, wherein the property is a duty cycle or a slew rate or a crossing point or a delay,
  optionally wherein the property is a duty cycle and the control circuitry is configured to obtain the measurement of the duty cycle by low-pass filtering the clock signal concerned.

13. The clock distribution circuitry as claimed in claim 1, wherein:
  the control circuitry comprises an analogue-to-digital converter and a digital-to-analogue converter; and
  the control circuitry is configured to employ the analogue-to-digital converter to convert the measurement into an input digital signal, to generate an output digital signal from the input digital signal for controlling the at least one said variable control signal, and to employ the digital-to-analogue converter to generate the at least one said variable control signal from the output digital signal.

14. The clock distribution circuitry as claimed in claim 1, wherein the control circuitry is configured to control any said control signals not controlled as variable signals to have a respective non-variable voltage level.

15. Clock distribution circuitry comprising:
  a plurality of first buffers and second buffers, the first and second buffers being inverting buffers; and
  control circuitry configured to generate first, second, third and fourth control signals,
  wherein:
  the first buffers each comprise a pull-up circuit comprising one or more pull-up transistors connected for bulk-voltage control by the first control signal and a pull-down circuit comprising one or more pull-down transistors connected for bulk-voltage control by the second control signal;
  the second buffers each comprise a pull-up circuit comprising one or more pull-up transistors connected for bulk-voltage control by the third control signal and a pull-down circuit comprising one or more pull-down transistors connected for bulk-voltage control by the fourth control signal;
  one of the first buffers and one of the second buffers are connected in series as a first buffer pair to form a first clock path for propagation of a clock signal therealong in a propagation direction;

another one of the first buffers and another one of the second buffers are connected in series as a second buffer pair to form a second clock path for propagation of a clock signal therealong in the propagation direction; and the control circuitry is configured to control at least one of the first to fourth control signals as a variable signal, wherein the buffers are larger in transistor size from buffer to buffer along each clock path in the propagation direction.

16. Clock distribution circuitry comprising:

a plurality of first buffers and second buffers, the first and second buffers being inverting buffers; and control circuitry configured to generate first, second, third and fourth control signals, wherein:

the first buffers each comprise a pull-up circuit comprising one or more pull-up transistors connected for bulk-voltage control by the first control signal and a pull-down circuit comprising one or more pull-down transistors connected for bulk-voltage control by the second control signal;

the second buffers each comprise a pull-up circuit comprising one or more pull-up transistors connected for bulk-voltage control by the third control signal and a pull-down circuit comprising one or more pull-down transistors connected for bulk-voltage control by the fourth control signal;

one of the first buffers and one of the second buffers are connected in series as a first buffer pair to form a first clock path for propagation of a clock signal therealong in a propagation direction;

another one of the first buffers and another one of the second buffers are connected in series as a second buffer pair to form a second clock path for propagation of a clock signal therealong in the propagation direction;

the control circuitry is configured to control at least one of the first to fourth control signals as a variable signal;

in the first buffer pair, the second buffer is connected in series after the first buffer in the propagation direction;

in the second buffer pair, the first buffer is connected in series after the second buffer in the propagation direction;

the first and second clock paths are arranged in parallel to one another, and connected to propagate complementary clock signals in parallel in the propagation direction;

cross-coupled inverters are connected between corresponding or like positions along the parallel clock paths;

each cross-coupled inverter pair comprises another one of the first buffers and another one of the second buffers; and for each cross-coupled inverter pair, the first buffer of the cross-coupled inverter pair is connected to receive a clock signal output from a second buffer of one of the parallel clock paths, and the second buffer of the cross-coupled inverter pair is connected to receive a clock signal output from a first buffer of the other of the parallel clock paths.

* * * * *